(12) United States Patent
Hayashi

(10) Patent No.: US 7,321,232 B2
(45) Date of Patent: Jan. 22, 2008

(54) CHARGE AMOUNT MEASUREMENT METHOD, SHIFT VALUE MEASUREMENT METHOD OF CHARGED BEAM, CHARGE AMOUNT MEASURING DEVICE AND SHIFT VALUE MEASURING DEVICE OF CHARGED BEAM

(75) Inventor: Masakazu Hayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 142 days.

(21) Appl. No.: 11/348,246

(22) Filed: Feb. 7, 2006

(65) Prior Publication Data

US 2006/0125495 A1     Jun. 15, 2006

Related U.S. Application Data

(62) Division of application No. 10/890,241, filed on Jul. 14, 2004, now Pat. No. 7,009,411, which is a division of application No. 10/200,503, filed on Jul. 23, 2002, now abandoned.

(30) Foreign Application Priority Data

Jul. 24, 2001   (JP)   ............................. 2001-222439

(51) Int. Cl.
    *G01R 31/305*   (2006.01)
    *H01J 37/28*   (2006.01)

(52) U.S. Cl. .................. 324/751; 250/306; 250/310; 324/750

(58) Field of Classification Search .................. None
    See application file for complete search history.

(56) References Cited

U.S. PATENT DOCUMENTS

| 2,240,304 A | 4/1941 | Koch |
| 2,394,196 A | 2/1946 | Morgan |
| 2,412,350 A | 12/1946 | Morgan |
| 2,457,575 A | 12/1948 | Liebscher |
| 4,339,721 A * | 7/1982 | Nihira et al. ................ 324/457 |
| 4,628,258 A | 12/1986 | Lischke |
| 4,835,461 A * | 5/1989 | Snelling ..................... 324/109 |
| 5,644,220 A | 7/1997 | Urs et al. |
| 6,479,820 B1 | 11/2002 | Singh et al. |

* cited by examiner

*Primary Examiner*—Ernest Karlsen
(74) *Attorney, Agent, or Firm*—Oblon, Spivak, McClelland, Maier & Neustadt, P.C.

(57) ABSTRACT

A charge amount measurement method comprises: interposing a measurement subject between a first substance and a second substance having a through hole; measuring a first collision position where a charged beam passed through the through hole and vicinity of the measurement subject collides against the first substance, in a state that there is no potential difference between the first substance and the second substance, measuring a second collision position where a charged beam passed through the through hole and vicinity of the measurement subject collides against the first substance, in a state that there is a potential difference between the first substance and the second substance, and measuring a charge amount of the measurement subject based on a difference between the measured first collision position and the measured second collision position.

2 Claims, 3 Drawing Sheets

CHARGE AMOUNT MEASUREMENT METHOD, SHIFT VALUE MEASUREMENT METHOD OF CHARGED BEAM, CHARGE AMOUNT MEASURING DEVICE AND SHIFT VALUE MEASURING DEVICE OF CHARGED BEAM

CROSS-REFERENCE TO RELATED APPLICATIONS

This application is based upon and claims the benefit of priority from the prior Japanese Patent Application No. 2001-222439, filed Jul. 24, 2001, the entire contents of which are incorporated herein by reference. This application is a division of Ser. No. 10/890,241, filed Jul. 14, 2004, now U.S. Pat. No. 7,009,411 which is a division of Ser. No. 10/200,503, filed Jul. 23, 2002, now abandoned.

BACKGROUND OF THE INVENTION

1. Field of the Invention

The present invention relates to a charge amount measuring method, a shift value measuring method of charged beam, a charge amount measuring device, and a shift value measuring device of charged beam.

2. Description of the Related Art

As supports of charged conductors in electric apparatuses and discharge application apparatuses, solid insulator is widely used. Since interface discharge occurs at interfaces between the solid insulator and surrounding liquid and gas, however, the surface of the solid insulator might be charged. If the solid insulator is charged, the surrounding electric field changes and there is also a risk that the function of an electric apparatus will not be fulfilled. Therefore, it is useful to secure the function of the electric apparatus to measure the charge amount of the solid insulator and measure the influence of the charged solid insulator on surroundings. As conventional methods for measuring charge amounts of insulation materials, the following methods are known. (1) A method of making a sensor approach a surface of an insulation material and measuring a charge amount induced electrostatically in the sensor by surface charge ("Creeping discharge and charge on surface of insulation material," Journal of The Institute of Electrical Engineers of Japan, Vol. 22, No. 3, 1998). (2) A method of making a Pockels crystal approach a surface of an insulation material and measuring surface charges on the basis of a voltage applied between end faces of the crystal by the Pockels effect ("Study of surface electrometer using Pockels effect," 2000 National Convention Record, The Institute of Electrical Engineers of Japan 1-064).

In the case of the method of (1), a size being lager than a predetermined size is required as the opposed area of the sensor, and the surface of the insulation material is supposed to be a plane like a sheet. Therefore, the method of (1) has a problem that a probe (resolution) of approximately $\phi$2 mm is minimum in the practical level. Furthermore, the method of (2) also has a problem that a probe of approximately several mm is minimum in the research level for a similar reason and the resolution is kept to approximately half of the probe size. Furthermore, in a technique of forming a measuring surface on the surface of the Pockels crystal, there is a possibility that the resolution of up to a wavelength order will be obtained, but there is a problem that the technique cannot be applied to typical insulation materials because the measuring subject is Pockels crystal itself. In Jpn. Pat. Appln. KOKAI Publication No. 7-288096, there is described a charge detection method of a sample capable of detecting the charged state of the sample automatically and simply. This method is a method of scanning the surface of the sample with an electron beam in a two dimensional manner, detecting a reflected electron signal, and thereby detecting the charge of the sample. However, there is a drawback that the charged state of the sample is changed by scanning the sample with the electron beam and there is a problem as regards the measurement precision.

BRIEF SUMMARY OF THE INVENTION

A charge amount measurement method according to the first aspect of the present invention comprises: interposing a measurement subject between a first substance and a second substance having a through hole; measuring a first collision position where a charged beam passed through the through hole and vicinity of the measurement subject collides against the first substance, in a state that there is no potential difference between the first substance and the second substance; measuring a second collision position where a charged beam passed through the through hole and vicinity of the measurement subject collides against the first substance, in a state that there is a potential difference between the first substance and the second substance; and measuring a charge amount of the measurement subject based on a difference between the measured first collision position and the measured second collision position.

In the first aspect it is preferable that, in the measurement of the second collision position, a potential of the first substance is made higher than a potential of the second substance, and the charged beam passes though the through hole substantially in parallel with a direction of an electric field generated between the first substance and the second substance.

A charge amount measurement method according to the second aspect of the present invention comprises: interposing a measurement subject between a first substance and a second substance having a through hole; measuring a collision position where a charged beam passed through the through hole and vicinity of the measurement subject collides against the first substance, in a state that there is a potential difference between the first substance and the second substance; and measuring a charge amount of the measurement subject based on the measured collision position.

A charge amount measurement method according to the third aspect of the present invention comprises: measuring a charge amount of a charged substance based on a shift value of the charged beam when a charged beam is passed through a vicinity of the charged substance.

A shift value measurement method of charged beam according to the fourth aspect of the present invention comprises: disposing a sample between two electrodes having a potential difference; emitting a charged beam to travel through vicinity of a sample after passing through one of the electrodes, and to collide against the other electrode; and measuring a collision position of the charged beam on the other electrode.

A charge amount measuring device according to the fifth aspect of the present invention comprises: a container capable of exhausting internal gas thereof; a beam emission part which emits a charged beam into the container; a first electrode disposed in a position where the charged beam emitted from the beam emission part collides; a second electrode disposed between the beam emission part and the first electrode, the second electrode being capable of being set lower in potential than the first electrode; a first measurement part which measures a position where the charge beam collides against the first electrode; and a second measurement part which measures a charge amount of a measurement subject disposed between the first electrode and the second electrode, based on the measured position.

In the fifth aspect, the following forms are preferable.

(1) The first measurement part comprises a CCD camera.

(2) The second electrode is a metal plate to which a slit is formed.

(3) The second electrode is a metal plate to which perpendicular linear slits to each other are formed.

(4) The first electrode comprises a transparent electrode film.

(5) The measurement subject is a glass.

(6) A turbo molecular pump which exhausts the gas in the container is further provided.

A charge amount measuring device according to the sixth aspect of the present invention comprises: a container capable of exhausting internal gas thereof; a first electrode and a second electrode disposed in the container, the second electrode being capable of being set lower in potential than the first electrode; a beam emission part which emits a charged beam passing through between the first electrode and the second electrode; an glass plate with fluorescent material against which the charged beam collides; a first measurement part which measures a collision position where the charge beam collides against the glass plate with fluorescent material; and a second measurement part which measures a charge amount of a charged substance disposed between the first electrode and the second electrode, based on the collision position.

In the sixth aspect, it is preferable to further comprise a magnetic field generation part which generates a magnetic field in at least a part of a region through which the charged beam passes.

A shift value measuring device of charged beam for measuring a shift value of a charged beam, the charged beam passing through vicinity of a sample disposed between two electrodes, at least one of the two electrodes having a through hole, the shift value measuring device of charged beam according to the seventh aspect of the present invention comprises: a container to house the sample, the container being capable of exhausting internal gas thereof; a beam emission part which emits the charged beam so as to make the charged beam pass through the through hole formed through one of the two electrodes and collide against the other of the two electrodes; and a measurement part which measures a position on the other electrode where the charge beam collides against the other electrode.

In the seventh aspect, it is preferable to further comprise: a second beam emission part to emit a charged beam passing through a vicinity of the sample and between the two electrodes; an glass plate with fluorescent material against which the charged beam collides; and a second measurement part to measure a position where the charged beam collides against the glass plate with fluorescent material.

Herein, "through hole" means a hole for passing through a charged beam. The shape of the through hole is not limited to a circle, but it may be a linear slit, a mesh, a square, a configuration for passing through the beam, or a configuration for passing through a part of the beam, such as an aperture. Herein, "vicinity" means a range less than half of the maximum length of the sample to which the charge amount is measured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiment of the invention, and together with the general description given above and the detailed description of the preferred embodiment given below, serve to explain the principles of the invention.

DETAILED DESCRIPTION OF THE INVENTION

First Embodiment

Figure 1:
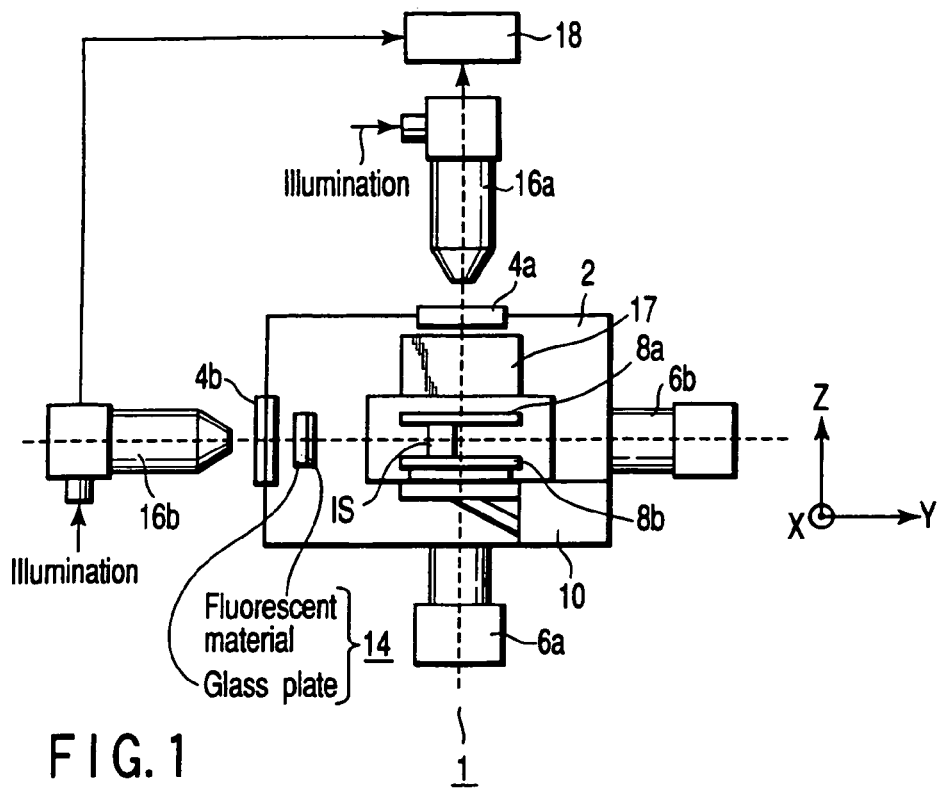
FIG. 1 is a configuration diagram of a charge amount measuring device 1 according to the present invention.

Hereafter, embodiments of the present invention will be described referring to the drawings.

FIG. 1 is a configuration diagram of a charge amount measuring device 1 according to the present invention. The measuring device 1 has two optical systems having optical axes that cross at substantially right angles. Each of the two optical systems includes an electron gun and a camera device. For convenience, a direction (a vertical direction on paper) parallel to a first optical system is defined as a Z axis, and a direction (a horizontal direction on paper) parallel to a second optical system is defined as a Y axis. A direction perpendicular to the Y axis and the Z axis is defined as an X axis.

Hereafter, components will be described.

A chamber 2 is connected to exhaust means (not illustrated), such as a turbo molecular pump and a rotary pump, and the inside thereof can be exhausted. A first electron gun 6a, a first view-port 4a to be disposed on a side wall of a chamber 2, and a first camera device 16a are substantially aligned along optical axis to be able to pick up an image at a position where a first electron beam collides a first electrode plate 8a. They form a first optical system.

So as to be able to pick up an image in a position where a tye II electron beam collides against an glass plate with fluorescent material 14, a second electron gun 6b for emitting the tye II electron beam, the glass plate with fluorescent material 14 against which the tye II electron beam collides, a second view-port 4b to be disposed on a side wall of the chamber 2, and a second camera device 16b for picking up an image in the position where the electron beam collides, via the view-port 4b are substantially aligned along optical axis. They form a second optical system. The glass plate with fluorescent material 14 is formed of a transparent circular glass plate. In order to show the collision position of the electron beam clearly, a fluorescent thing is applied to a surface of the glass plate with fluorescent material 14 opposed to the second electron gun 6b.

Each of the first and second electron guns 6a and 6b has a function of emitting an electron beam into the chamber 2. Each of the first and second electron guns 6a and 6b includes typically known electronic optical element parts, such as a tungsten filament of hairpin type for emitting electrons when heated to a high temperature, an acceleration electrode (anode electrode) for providing an emitted electron beam with kinetic energy of several eV to several hundreds eV (several tens keV when it is large), an electron lens (typically of electrostatic or magnetic type) for converging the electron beam, an aperture for controlling the size of the electron beam, a deflector for controlling a traveling angle of the electron beam, and an astigmatism corrector for controlling deformation of a circular electron beam part.

Each of the first and second camera devices includes an optical microscope and a CCD camera for picking up an optical image. Image data picked up by the CCD camera is output to a personal computer (PC) (charge calculating device 18), which incorporates image processing software. The charge amount of the solid insulator IS is calculated on the basis of image data.

Figure 2:
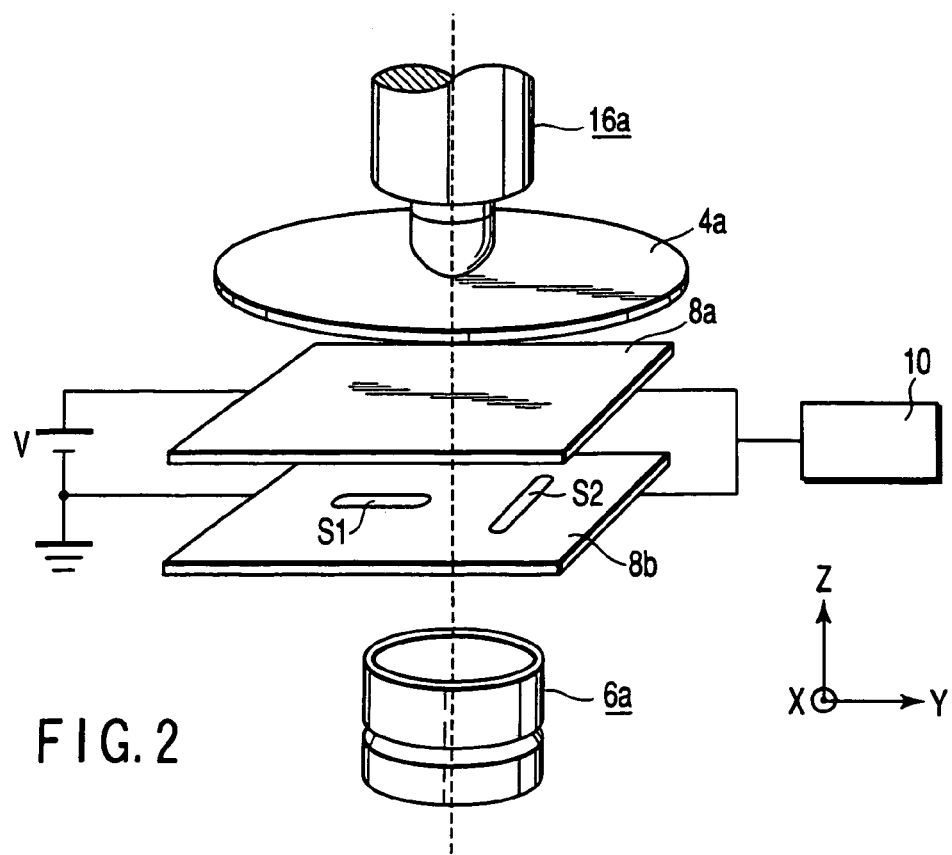
FIG. 2 is a diagram showing schematically first and second electrode plates 8a and 8b.

FIG. 2 is a diagram showing schematically the first and second electrode plates 8a and 8b.

The first electrode plate 8a is formed of a transparent member, such as glass, so as to make possible observation using the first camera device 16a. In order to implement an electrode function, a transparent electrode film made of ITO or the like is formed on a surface of the first electrode plate 8a opposed to the second electrode plate 8b. Furthermore, in order to make the collision position of the electron beam luminescent clearly when the electron beam is irradiated, a fluorescent material is further applied to the surface of the transparent electrode film.

On the other hand, on the second electrode plate 8b formed of metal in order to implement the electrode function, two linear slits S1 and S2 perpendicular to each other and each having a width of several tens μm to several hundreds μm are formed so as to be able to pass the electron beam therethrough.

The electrode plates 8 are electrically connected to a high voltage power supply V disposed, for example, outside the chamber 2 by lead lines so as to provide the first electrode plate 8a with a positive potential. A maximum voltage of, for example, several tens kV can be thus applied.

Hereafter, operation of the charge amount measuring device with the above-mentioned configuration will be described.

Figure 3:
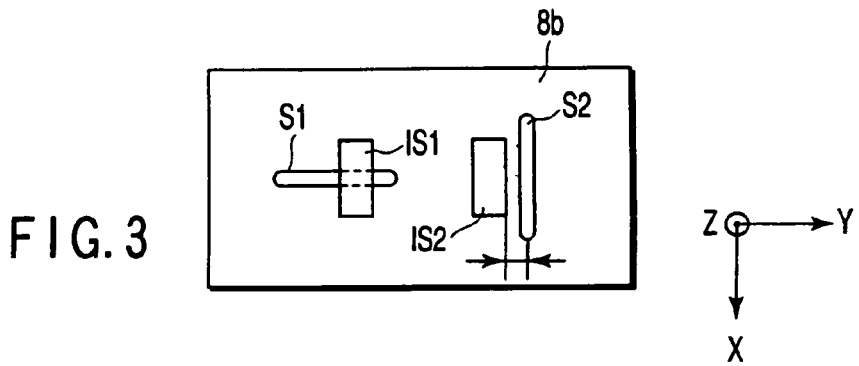
FIG. 3 is a diagram showing a positional relation between a solid insulator IS and an electrode plate 8b.

First, a solid insulator IS serving as a sample is interposed between the electrode plates 8a and 8b. As for the material of the solid insulator IS, various shapes and materials are considered according to the application. It is now supposed that the charge amount generated in square pillar glass having a height of 2 mm is measured when the glass is interposed between high voltage plates. FIG. 3 shows a positional relation between the solid insulator IS and the electrode plate 8b. As described above, the second electrode plate 8b has the two perpendicular linear slits S1 and S2 for passing electrons therethrough. Two solid insulators IS1 and IS2 are interposed between binding agents, which is not illustrated, so as to correspond to the slits. In other words, one solid insulator IS1 is disposed so as to correspond to the slit S1. By measuring change values of the electron beam when the distance between the solid insulator IS1 and the slit S1 is changed by a moving stage 10, the precision of the charge amount measurement can be improved. The other solid insulator IS2 is disposed at a predetermined space L from the slit S2. By measuring the charge amount when the solid insulator IS2 is moved by the moving stage 10, the charge distribution of the IS2 in the X-Z plane can be measured. In the present embodiment, the distance L between the slit S2 and the solid insulator IS2 is, for example, 300 μm.

Thereafter, position alignment is conducted by using the moving stage 10 so that the first electron beam emitted from the first electron gun 6a passes through the slit S2. Subsequently, a voltage of, for example, 10 kV is applied between electrode plates. Hereafter, operation of the charge amount measurement of each observation system will be described.

First Observation System

Figure 4:
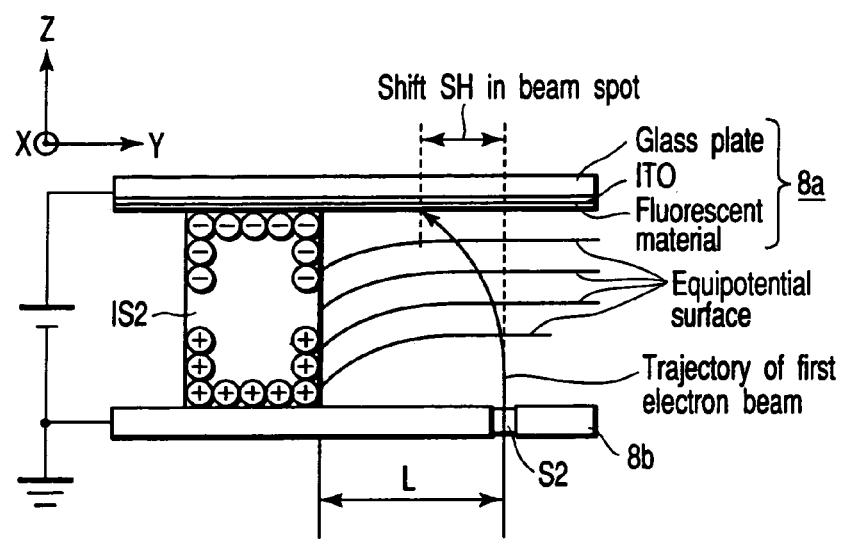
FIG. 4 is a diagram showing schematically an appearance of deflection of an electron beam in a first observation system.

FIG. 4 is a diagram showing schematically an appearance of deflection of the electron beam by the first observation system. An electron beam emitted from the first electron gun 6a with kinetic energy of several hundreds eV travels in the chamber 2 substantially in parallel with the Z axis. A large electric field is not generated in the chamber 2 except a region between electrode plates. The electron beam travels linearly. Thereafter, the electron beam passes through the slit S1, and travels in a region between the electrode plates 8. Since the high voltage of, for example, 10 kV is applied between the electrode plates as described above, the electron beam travels to the first electrode plate 8a while being accelerated to 10 keV. On the other hand, since the solid insulator IS functions as a kind of a capacitor between the electrode plates, static charge is formed within the solid insulator IS and on the surface of the solid insulator IS. How the solid insulator IS is charged changes diversely depending on the physical properties and shape of the solid insulator IS. In general, however, negative charges are accumulated on the surface of the positive electrode and positive charges are accumulated on the surface of the negative electrode as shown in FIG. 4 in many cases. Near the solid insulator IS2, therefore, the parallel electric field is distorted, and consequently the electron beam is deflected toward the solid insulator IS2 and collides against the first electrode plate 8a. At the time of colliding, light is emitted in the collision position and the image is picked up by the first camera device 16a.

It becomes possible to measure a shift value SH of beam spot in beam spot by previously picking up an image in a collision position when an electric field is not acted at all and comparing the collision positions. By measuring SH, the distortion of the parallel electric field, i.e., the distribution of the charge amount on the surface of the solid insulator IS2 can be measured.

Hereafter, computation processing of deriving the charge distribution will be described. The computation processing described below is conducted by the charge calculating device 18.

First, a charge amount C on the surface of the solid insulator IS2 is defined as $C=F1(z)$. Namely, supposing that there is a distribution of the charge amount in the Z axis direction, the charge amount C is defined as a function of Z. The distribution curve of F1 can be presumed on the basis of existing papers and measurement results obtained from solid insulators of large scales (such as at least the order of several tens mm) by using the Pockels effect or the like.

Supposing now that the distribution curve is $(a0+a1 \times Z+a2 \times Z^2 + \ldots)$ (where ai is a known constant), C can be represented as:

$$C=K(a0+a1 \times Z+a2 \times Z^2+ \ldots) \quad (1)$$

where K is an unknown proportionality constant.

On the other hand, the shift value SH of beam spot is defined as:

$$SH=F2(C, L)$$

where L is the distance between the electron beam and the solid insulator IS2 at the time when the electron beam passes through the slit. In the case of the present embodiment, L=300 µm as described above.

F2 is represented as a function of the shift value SH of beam spot and the charge amount C. Supposing that L is a constant, this function can be obtained by, for example, simulation. It is now supposed that the following relation is satisfied:

$$SH=(b0+b1 \times C+b2 \times C^2+ \ldots) \quad (2)$$

where bi is a known constant.

Therefore, it becomes possible to calculate the unknown proportionality constant K by substituting SH into the equation (2), calculating C, and substituting C into the equation (1). Thus it becomes possible to measure the charge distribution on the surface of the solid insulator IS2 in the Z axis direction represented by the equation (1).

It is possible to measure the charge distribution of the solid insulator by the procedure heretofore described. Especially, it is possible to measure the charge amount of a minute insulation material of approximately several millimeters, which has heretofore been impossible.

The measurement resolution in the X-Y plane is determined by a smaller one of the slit size and the spot size of the electron beam. In the case of the present embodiment, the slit size is several tens µm. However, the spot size of the charged beam such as the electron beam can be adjusted to become the order of µm or less. As a result, it becomes possible to implement the measurement with a high resolution.

Furthermore, by moving the solid insulator IS2 and the electrode plates 8a and 8b as one body in parallel with the X axis by using the moving stage 10, it becomes possible to measure the charge distribution on the surface of the solid insulator in the X-Z plane.

Furthermore, in the same way, the charge distribution on the surface of the solid insulator can be measured through the shift value measurement of an electron beam that passes through the slit S1 and passes through the vicinity of the solid insulator IS1. In this case, by moving the solid insulator IS1 and the electrode plates 8a and 8b as one body in parallel with the Y axis by using the moving stage 10, it becomes possible to measure the charge amount with changing the L. Therefore, by measuring the charge distribution with different L values and averaging the distribution, the measurement precision can be improved. If the L is gradually decreased, then the electron beam collides against the solid insulator IS1 and consequently light emission in the first electrode plate 8a disappears. By measuring L at this time with respect to solid insulators having various shapes, the shape of the solid insulator having reduced distortion with respect to the electric field can be advantageously known with ease.

In the present embodiment, glass is used as the solid insulator. However, the solid insulator is not limited to this, but, for example, magnesium oxide or alumina ceramics may also be used. Application of the present invention is not limited to insulation materials, but the present invention may also be applied to semiconductors such as silicon.

Second Embodiment

Second Observation System

When measuring the charge amount C on the surface of the solid insulator IS in the first embodiment, the charge amount is measured by presuming the distribution curve of the charge amount as:

$$C=K(a0+a1 \times Z+a2 \times Z^2+ \ldots)$$

(where ai is a constant).

In some cases, however, the shape of the solid insulator IS is special and it is difficult to presume the charge distribution curve. Furthermore, it is also conceivable that the charge distribution curve in the case of a large scale differs from that in the case of several mm or less as in the present embodiment even if the shapes are similar.

In such a case, the charge distribution curve of the solid insulator IS in the Z axis direction can be measured by using a second observation system, i.e., a measurement system in which the electron beam travels substantially in parallel with the electrode surface (in the Y axis direction).

At the time of the measurement, it is necessary to use a trajectory compensation device 17, which is not used in the first embodiment. First, therefore, its necessity will now be described.

When the electron beam travels in the electric field, the electric field acts forces on electrons. When the electron beam travels between the electrode plates 8, therefore, the electron beam is deflected toward the first electrode plate 8a serving as the positive electrode. In the case where the kinetic energy of the electron beam is small or in the case where it is necessary to act a large electric field, therefore, it becomes difficult to conduct observation by using the second observation system because the electron beam collides against the first electrode plate 8a. Therefore, a magnetic field is generated by using the trajectory compensation device 17, and the electron beam corrected thereby in trajectory collides against the glass plate with fluorescent material 14.

Figure 5:
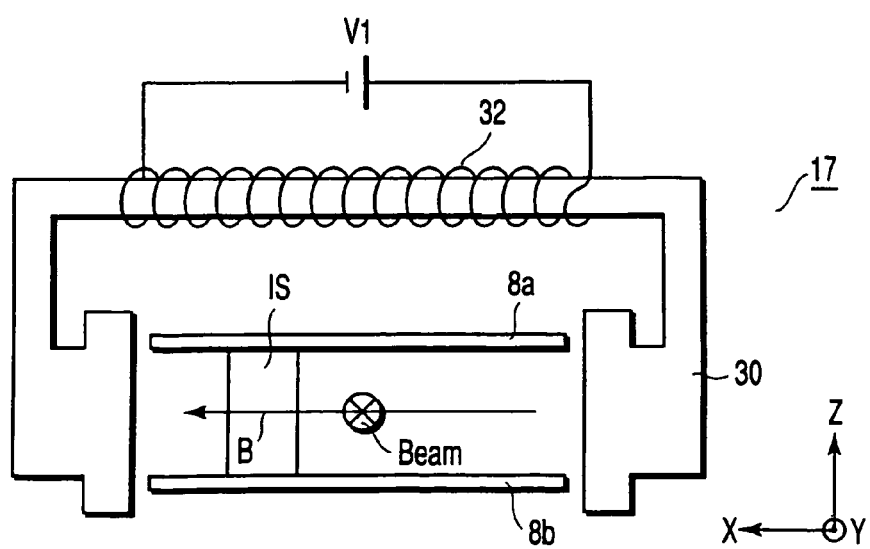
FIG. 5 is a diagram showing schematically a form of a trajectory compensation device 17.

FIG. 5 shows a form of the trajectory compensation device 17. As shown in FIG. 5, an electromagnetic coil 32 is wound around a U-shaped metal substance 30, and a magnetic field is generated in a region between the electrode plates 8 in the X axis direction. By generating a magnetic field in the X direction (a direction directed from the right toward the left on the paper), a force in the negative direction of z (in the direction directed from the top toward the bottom on the paper) is acted on the electron beam traveling in the Y axis direction (in the direction perpendicular to the paper). Therefore, it is possible to prevent the tye II electron beam from colliding against the first electrode plate 8a. The magnitude of the generated magnetic field should be suitably set on the basis of the magnitude of the kinetic energy applied to the electron beam and the magnitude of the electric field between electrodes. In the technique of generating a magnetic field by using the electromagnetic coil 32, therefore, the magnitude of the magnetic field can be adjusted, resulting in convenience. However, other means may also be used. For example, the magnetic field may be generated by using permanent magnets.

A measurement method of the charge distribution in the Z axis direction in the above described configuration will now be described. The electron beam emitted from the second electron gun 6b travels substantially in parallel with the Y axis direction and travels into a region between the electrode plates 8. Hereafter, a change of the electron beam in the Z axis direction and a change of the electron beam in the X axis direction will be described in order.

Change in Z Axis Direction

Figure 6:
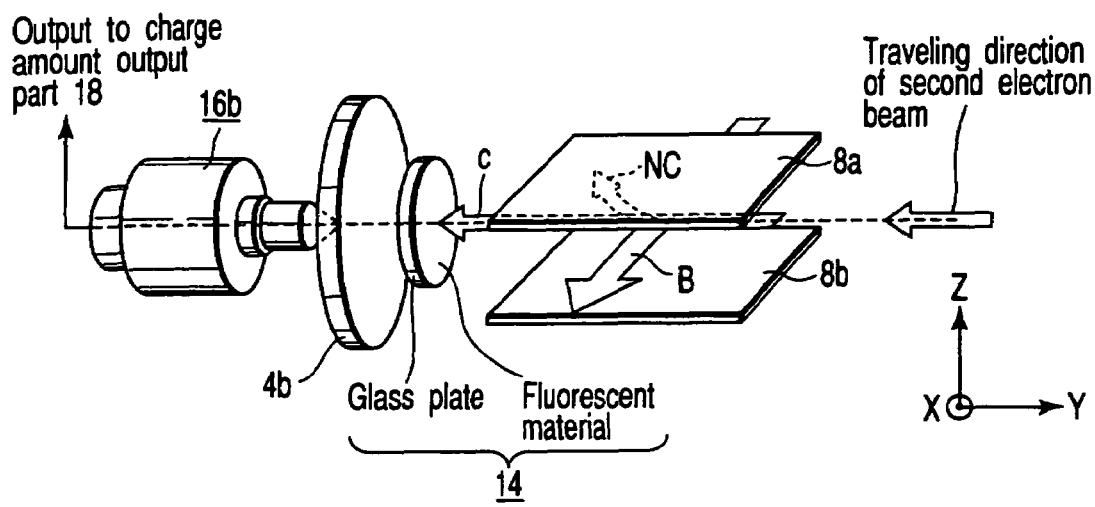
FIG. 6 is a schematic diagram showing an appearance of deflection of a tye II electron beam.

FIG. 6 is a schematic diagram showing an appearance of the tye II electron beam is deflected.

Between the electrode plates, an electric field in the negative direction of the Z axis is generated. An upward force in the Z axis direction is acted on the tye II electron beam. On the other hand, a magnetic field in the positive direction of the X axis direction is generated in this region. A downward force in the Z axis direction is acted on the tye II electron beam. In the Z axis direction, therefore, the electron beam is deflected on the basis of a resultant force of them. While the trajectory is NC originally as shown in FIG. 6, therefore, the beam trajectory is corrected to become C (Fleming's left-hand rule) and the electron beam can pass between the electrodes.

For example, if an adjustment is effected beforehand so as to make both forces substantially equal to each other, then the electron beam travels with substantially no change in the Z axis direction. If a uniform magnetic field is generated between metal plates by making both end faces of the metal substance 30 sufficiently large, then the resultant force acted on the electron beam in the Z axis direction becomes substantially equal in any position between the metal plates. Therefore, control of the electron beam in the Z axis direction can be conducted easily.

Change in X Axis Direction

By generating a high electric field between the electrode plates, a charge bias occurs on the surface of the solid insulator IS, as described with reference to the first embodiment. While a uniform magnetic field is generated downward in the Z axis direction when there is no solid insulator, therefore, the electric field is distorted because of existence of the solid insulator IS. Especially in the vicinity of the solid insulator IS, a large distortion is generated. As a result, the electron beam is deflected.

Specifically, when positive charges are accumulated on the surface, the electron beam is deflected so as to be drawn toward the positive charges. When negative charges are accumulated on the surface, the electron beam is deflected so as to go away from the negative charges. And the deflection amount is based upon the charge amount.

After passing through the solid insulator IS, the deflected electron beam collides against the glass plate with fluorescent material 14 and thereby causes light emission. Its image is picked up by the second camera device 16b. The picked up image signal is supplied to the charge calculating device 18 to calculate the charge amount.

For example, by comparing the collision position on the glass plate with fluorescent material 14 with that in a state that a voltage is not applied to the electrode plates and consequently there is no potential difference between the electrodes, the deflection amount (shift value) of the electron beam can be calculated. The charge amount can be calculated on the basis of the shift value of the electron beam.

Hereafter, a procedure of calculating the charge amount on the basis of the shift value $\epsilon$ will be described.

Figure 7:
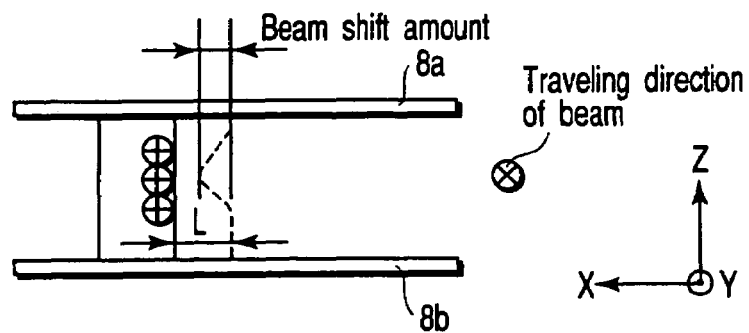
FIG. 7 is a diagram showing a beam deflection in an X axis direction.

The shift value $\epsilon$ of the electron beam is related to the charge amount C by the following relation $$\epsilon(Z)=G2(C, L)$$

where L is a distance between the solid insulator IS and the trajectory of the electron beam in the case where there is no deflection in the X axis direction (see FIG. 7, which shows the beam deflection in the X axis direction). G2 is a function representing the relation between L and C and the shift value $\epsilon$. The function G2 can be determined by, for example, simulation.

Therefore, C can be calculated by substituting $\epsilon$ into the following equation.

$$C=G2^{-1}(\epsilon(Z))$$

Subsequently, by successively conducting measurements of the shift value while moving the solid insulator little by little in the Z axis direction by using the moving stage 10, it becomes possible to measure the charge distribution in the Z axis direction. As the passing position of the electron beam approaches the first electrode plate 8a, however, the possibility of the electron beam colliding against the first electrode plate 8a becomes high. Therefore, the magnitude of the generated magnetic field may be changed suitably.

By increasing the distance between the position of the glass plate with fluorescent material 14 and the position of the electrode plates, the shift value based on the beam deflection is increased. Therefore, measurements with a high resolution becomes possible by keeping the position of the glass plate with fluorescent material 14 away from the position of the electrode plates.

Since light is emitted from the ITO film by the electron beam, observation is possible in some cases even without a fluorescent material.

Instead of moving the solid insulator by using the moving stage 10, a mechanism for moving the beam may also be used.

Furthermore, there may be adopted a configuration in which a database for associating collision positions with charge amounts is created beforehand and the charge amount is derived directly from the collision position without deriving the shift value. Furthermore, in the present embodiment, by interposing a solid insulator between electrodes having a potential difference and passing the electron beam in the vicinity of the solid insulator, the charge amount of the solid insulator is measured. By doing so, the charge amount can be measured when the solid insulator is used as a support between substances having a potential difference such as a support of a charged conductor.

In the present embodiment, the measurement subject is interposed between two electrodes. However, it is not always necessary. That is, if the measurement subject is charged, a distortion is generated in the surrounding electric field by an influence of the charge of the measurement subject irrespective of whether the measurement subject is interposed between the two electrodes. When a charged beam is passed though the vicinity of the measurement subject, therefore, the charged beam is deflected under the influence of the charge even if the measurement subject is not interposed between the electrodes. As a result, the charge amount can be measured.

Furthermore, in the first embodiment, the charged beam travels against the direction of the electric field (i.e., the direction directed from the positive potential to the negative potential). By doing so, the charged beam travels straight substantially without being deflected in the case where there is no distortion in the electric field. Therefore, there is an effect that the influence of the distortion of the electric field in the case where there is a charged substance becomes more definite and the measurement precision is improved. However, the present invention can be applied diversely. For example, the charged beam may travel in a slant electric field, or the measurement may be conducted by making the charged beam travel in a dynamically changing electric field.

The present embodiment uses a technique in which the position of the beam colliding against the fluorescent material is observed by using an optical microscope and the beam position can be detected by using a CCD camera. The collision position of the electron beam may be measured by using a different technique. Any technique capable of detecting the electron beam position may be used. For example, a device obtained by combining the MCP, the fluorescent material, and solid image pickup devices, or a technique of conducting two-dimensional scanning by using pin holes (or a mesh) and a Faraday cup and detecting the electron beam position may be used. Furthermore, a sensor for outputting an electric signal on the basis of the irradiation position of the electron beam may also be used.

Instead of applying a fluorescent material on the surface of the transparent electrode film, there may be a method of applying a fluorescent material on glass as in the CRT and effecting aluminum back coating thereon. Furthermore, the collision position may be measured by using a conductive fluorescent material alone.

In the present embodiment, one object is to measure the charge amount of a solid insulator. When it is desired to know the influence of the deflection of the electron beam based on the distortion of the electric field given to the surroundings by a charged substance, however, the present invention may be applied to the measurement of the shift value of the electron beam and the calculation and measurement of the charge amount may not be conducted.

Furthermore, the present invention can be applied to not only an electron beam but also a charged beam such as an ion beam.

In the present embodiment, a moving stage capable of conducting three-dimensional driving is used. In addition, however, a moving stage in the rotation direction may also be used. For example, a moving stage capable of giving rotation around the Z axis may also be used. In this case, it becomes possible to easily measure the charge distribution on all side faces of the solid insulator. Therefore, the effect is large especially when the shape of the solid insulator is asymmetric.

Furthermore, the shape of the slit is not limited to a line, but it may be a round hole, a square, or a curved line. The shape may also be a mesh. The arrangement of the slit and the solid insulator may be modified diversely. For example, if a linear slit parallel to the Y axis direction is used, the distribution on the Y-Z plane may be measured. While the ± electrode is made of a metal plate and a transparent member, it may be a metal or semiconductor mesh that transmits an electron beam. When a mesh is used as the transparent member, glass with a fluorescent material or a Faraday cup is disposed behind that to detect an electron beam.

While a device having measurement systems of two axes, i.e., the in-plane direction and the height direction is used, a device having only a measurement system of one axis may also be used.

When a Pockels cell is used as the measurement subject, a device using both the first optical system and the Pockels optical measurement system may also be used.

In the first embodiment and the second embodiment, an electron gun using thermal electrons obtained by the W hairpin is exemplified as a configuration of an electron gun. However, an electron gun using a thermal electric field electron gun (TFE) or an electric field electron gun (cold cathode CFE) may also be used. In addition, an electron gun using a micro emitter obtained by using a semiconductor process may also be employed.

Furthermore, if the electric field between the electrodes is weak, or if the electron beam energy is large (in this case, the measurement sensitivity becomes low), and if the electron beam of the second observation system does not collide against the top or bottom electrode without the magnetic field and runs through, then the trajectory compensation device can be omitted.

The measurement subject is not limited to an insulation material, but it may be a member obtained by applying coating on a surface of an insulation material, or a semiconductor.

As for the exhaust system as well, the exhaust system of the RP (rotary pump) and the TMP (turbo molecular pump) is exemplified. However, the pump is not limited to them, but any pump, such as a sorption pump, an ion pump, a cryopump, or a getter pump, may be used. Furthermore, when there is no internal gas emission, the measurement may be conducted by forming a sealed device after the initial exhaust.

According to the present invention, charge on the surface of an insulation material (approximately 1 mm or less when it is small) disposed in a minute space can be measured with a high resolution without a limitation on the material of the insulation material.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charge amount measurement method comprising:
    interposing a measurement subject between a first substance and a second substance having a through hole;
    measuring a first collision position where a charged beam passed through the through hole and vicinity of the measurement subject collides against the first substance, in a state that there is no potential difference between the first substance and the second substance;
    measuring a second collision position where a charged beam passed through the through hole and vicinity of the measurement subject collides against the first substance, in a state that there is a potential difference between the first substance and the second substance; and
    measuring a charge amount of the measurement subject based on a difference between the measured first collision position and the measured second collision position.

2. The charge amount measurement method according to claim 1, wherein in the measurement of the second collision position, a potential of the first substance is made higher than a potential of the second substance, and the charged beam passes though the through hole substantially in parallel with a direction of an electric field generated between the first substance and the second substance.

* * * * *